(12) United States Patent
Ko et al.

(10) Patent No.: US 8,093,690 B2
(45) Date of Patent: Jan. 10, 2012

(54) CHIP PACKAGE AND MANUFACTURING METHOD THEREOF

(75) Inventors: Dongkyun Ko, Kyunggi-Do (KR); Jung Lee, Kyunggi-Do (KR); Jaesun An, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 175 days.

(21) Appl. No.: 12/414,996

(22) Filed: Mar. 31, 2009

(65) Prior Publication Data

US 2010/0109132 A1    May 6, 2010

Related U.S. Application Data

(60) Provisional application No. 61/109,937, filed on Oct. 31, 2008.

(51) Int. Cl.
*H01L 23/552* (2006.01)
*H01L 21/78* (2006.01)

(52) U.S. Cl. ......... 257/660; 257/E23.114; 257/E21.599; 438/113

(58) Field of Classification Search .................. 257/659, 257/660
See application file for complete search history.

(56) References Cited

U.S. PATENT DOCUMENTS

| | | |
|---|---|---|
| 4,569,786 A | 2/1986 | Deguchi |
| 4,814,205 A | 3/1989 | Arcilesi et al. |
| 5,166,772 A | 11/1992 | Soldner et al. |
| 5,353,498 A | 10/1994 | Fillion et al. |
| 5,355,016 A | 10/1994 | Swirbel et al. |
| 5,557,142 A | 9/1996 | Gilmore et al. |
| 5,639,989 A | 6/1997 | Higgins, III |
| 5,677,511 A | 10/1997 | Taylor et al. |
| 5,694,300 A | 12/1997 | Mattei et al. |
| 5,726,612 A * | 3/1998 | Mandai et al. ............... 333/184 |
| 5,776,798 A | 7/1998 | Quan et al. |
| 5,886,876 A | 3/1999 | Yamaguchi |
| 5,895,229 A | 4/1999 | Carney et al. |
| 5,898,344 A * | 4/1999 | Hayashi ........................ 331/67 |
| 5,998,867 A | 12/1999 | Jensen et al. |
| 6,093,972 A | 7/2000 | Carney et al. |
| 6,150,193 A | 11/2000 | Glenn |
| 6,225,694 B1 | 5/2001 | Terui |
| 6,376,769 B1 | 4/2002 | Chung |

(Continued)

FOREIGN PATENT DOCUMENTS

JP    08-288686    1/1996

(Continued)

OTHER PUBLICATIONS

An et al. "Semiconductor Device Packages with Electromagnetic Interference Shielding" U.S. Appl. No. 12/432,621, filed Apr. 29, 2009.

(Continued)

*Primary Examiner* — N Drew Richards
*Assistant Examiner* — Robert Carpenter
(74) *Attorney, Agent, or Firm* — Cooley LLP

(57) ABSTRACT

A chip package including a shielding layer having a plurality of conductive connectors for better electromagnetic interferences shielding is provided. The conductive connectors can be flexibly arranged within the molding compound for better shielding performance. The shielding layer having the conductive connectors functions as the EMI shield and the shielding layer is electrically grounded within the package structure.

18 Claims, 16 Drawing Sheets

U.S. PATENT DOCUMENTS

| | | | |
|---|---|---|---|
| 6,566,596 B1 * | 5/2003 | Askew | 174/391 |
| 6,614,102 B1 | 9/2003 | Hoffman et al. | |
| 6,635,953 B2 * | 10/2003 | Wu | 257/659 |
| 6,686,649 B1 | 2/2004 | Mathews et al. | |
| 6,740,546 B2 | 5/2004 | Corisis et al. | |
| 6,740,959 B2 | 5/2004 | Alcoe et al. | |
| 6,757,181 B1 | 6/2004 | Villanueva et al. | |
| 6,781,231 B2 | 8/2004 | Minervini | |
| 6,865,084 B2 | 3/2005 | Lin et al. | |
| 6,881,896 B2 | 4/2005 | Ebihara | |
| 6,962,869 B1 | 11/2005 | Bao et al. | |
| 7,030,469 B2 | 4/2006 | Mahadevan et al. | |
| 7,081,661 B2 | 7/2006 | Takehara et al. | |
| 7,161,252 B2 | 1/2007 | Tsuneoka et al. | |
| 7,186,928 B2 | 3/2007 | Kikuchi et al. | |
| 7,187,060 B2 | 3/2007 | Usui | |
| 7,327,015 B2 | 2/2008 | Yang et al. | |
| 7,342,303 B1 | 3/2008 | Berry et al. | |
| 7,451,539 B2 * | 11/2008 | Morris et al. | 29/832 |
| 7,478,474 B2 | 1/2009 | Koga | |
| 7,488,903 B2 | 2/2009 | Kawagishi et al. | |
| 7,576,415 B2 | 8/2009 | Cha et al. | |
| 7,629,674 B1 | 12/2009 | Foster | |
| 7,633,170 B2 | 12/2009 | Yang et al. | |
| 7,633,765 B1 | 12/2009 | Scanlan et al. | |
| 7,656,047 B2 | 2/2010 | Yang et al. | |
| 7,700,411 B2 | 4/2010 | Yang et al. | |
| 7,745,910 B1 | 6/2010 | Olson et al. | |
| 7,829,981 B2 | 11/2010 | Hsu | |
| 2004/0020673 A1 | 2/2004 | Mazurkiewicz | |
| 2004/0150097 A1 | 8/2004 | Gaynes et al. | |
| 2004/0178500 A1 | 9/2004 | Usui | |
| 2004/0231872 A1 | 11/2004 | Arnold et al. | |
| 2004/0252475 A1 | 12/2004 | Tsuneoka et al. | |
| 2005/0013082 A1 | 1/2005 | Kawamoto et al. | |
| 2005/0029673 A1 | 2/2005 | Naka et al. | |
| 2005/0039946 A1 | 2/2005 | Nakao | |
| 2005/0045358 A1 | 3/2005 | Arnold | |
| 2005/0208702 A1 | 9/2005 | Kim | |
| 2006/0145361 A1 | 7/2006 | Yang et al. | |
| 2006/0266547 A1 | 11/2006 | Koga | |
| 2008/0042301 A1 | 2/2008 | Yang et al. | |
| 2008/0061407 A1 | 3/2008 | Yang et al. | |
| 2008/0174013 A1 | 7/2008 | Yang et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002970 A1 | 1/2009 | Leahy et al. | |
| 2009/0002971 A1 | 1/2009 | Carey et al. | |
| 2009/0002972 A1 | 1/2009 | Carey et al. | |
| 2009/0025211 A1 | 1/2009 | Hiner et al. | |
| 2009/0035895 A1 | 2/2009 | Lee et al. | |
| 2009/0075428 A1 * | 3/2009 | Tang et al. | 438/114 |
| 2009/0102003 A1 | 4/2009 | Vogt et al. | |
| 2009/0194851 A1 | 8/2009 | Chiu et al. | |
| 2009/0194852 A1 | 8/2009 | Chiu et al. | |
| 2009/0230523 A1 | 9/2009 | Chien et al. | |
| 2009/0230524 A1 | 9/2009 | Chien et al. | |
| 2009/0230525 A1 | 9/2009 | Chien et al. | |
| 2009/0230526 A1 | 9/2009 | Chen et al. | |
| 2009/0236700 A1 | 9/2009 | Moriya | |
| 2009/0256244 A1 | 10/2009 | Liao et al. | |
| 2009/0294928 A1 * | 12/2009 | Kim et al. | 257/659 |
| 2010/0013064 A1 | 1/2010 | Hsu | |
| 2010/0032815 A1 | 2/2010 | An et al. | |
| 2010/0110656 A1 | 5/2010 | Ko et al. | |
| 2010/0207257 A1 | 8/2010 | Lee et al. | |
| 2010/0207258 A1 | 8/2010 | Eun et al. | |
| 2010/0207259 A1 | 8/2010 | Liao et al. | |

FOREIGN PATENT DOCUMENTS

| | | |
|---|---|---|
| WO | 2004060034 | 7/2004 |

OTHER PUBLICATIONS

Lee et al. "Semiconductor Device Packages With Electromagnetic Interference Shielding." U.S. Appl. No. 12/622,419, filed Nov. 19, 2009.

Kim et al. "Semiconductor Device Packages With Electromagnetic Interference Shielding." U.S. Appl. No. 12/622,415, filed Nov. 19, 2009.

Chiu et al. "Wafer-Level Semiconductor Device Packages With Electromagnetic Interference Shielding." U.S. Appl. No. 12/622,393, filed Nov. 19, 2009.

Weng et al., "Semiconductor Package and Manufacturing Methods Thereof." U.S. Appl. No. 12/955,782, filed Nov. 29, 2010.

* cited by examiner

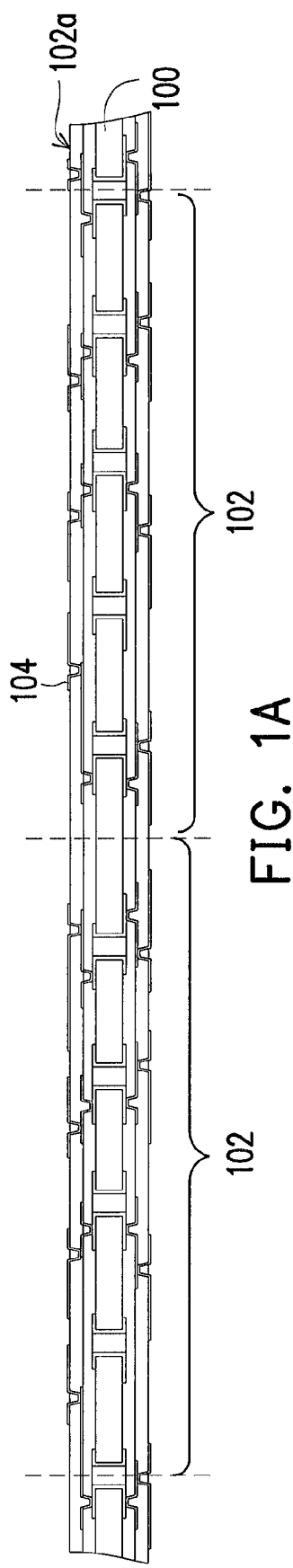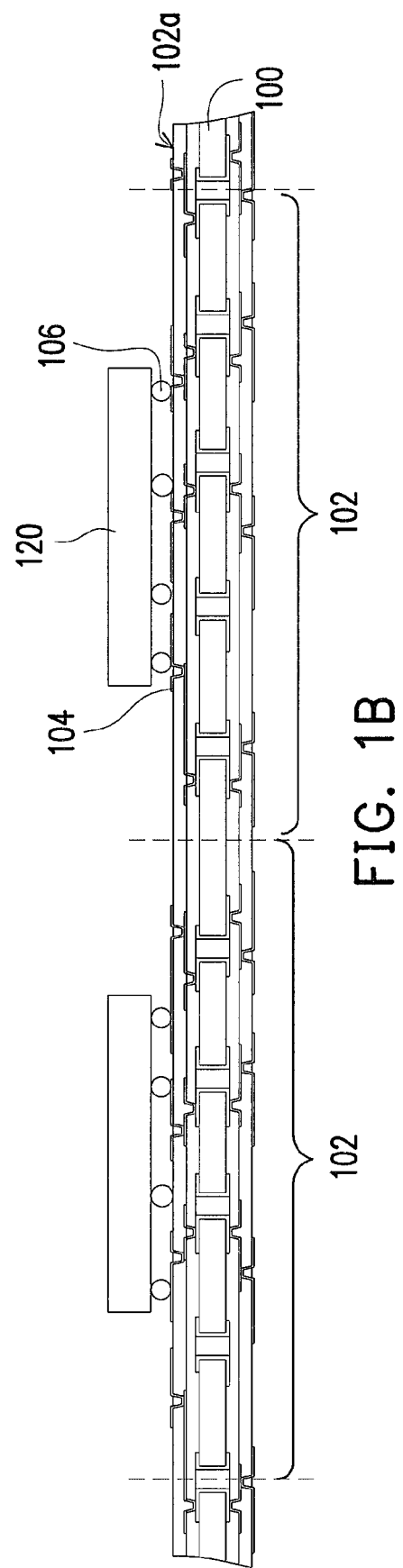

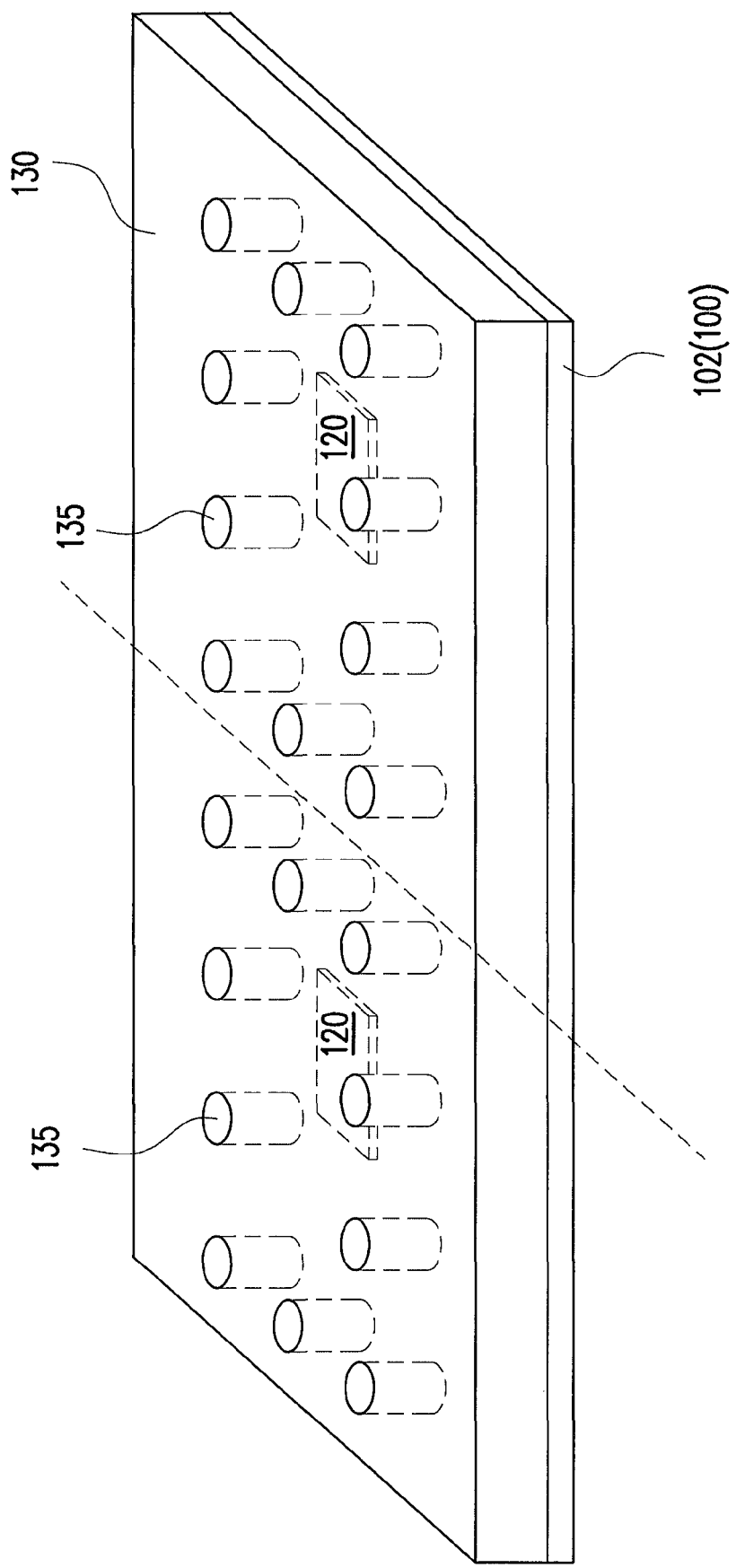
FIG. 1D"

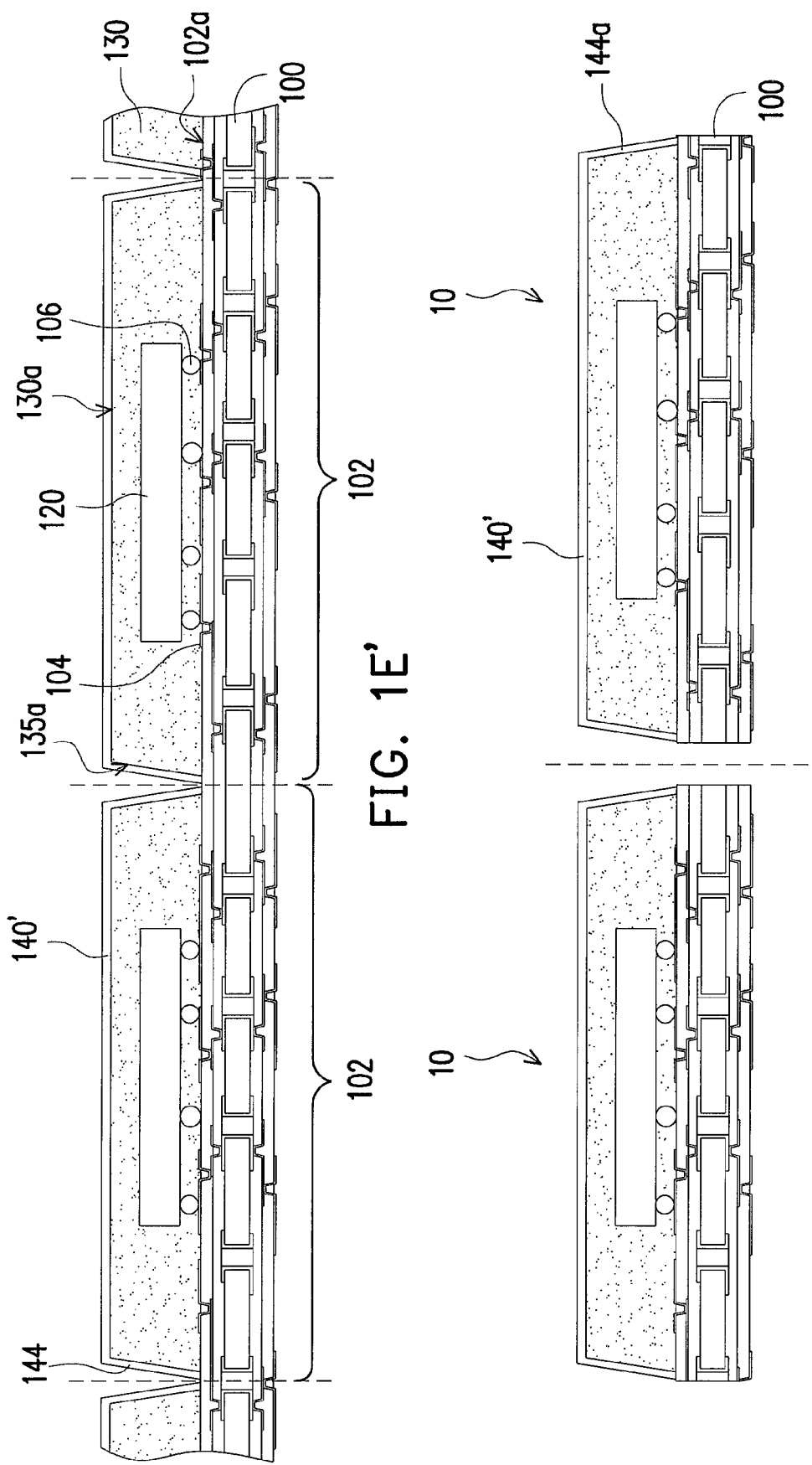

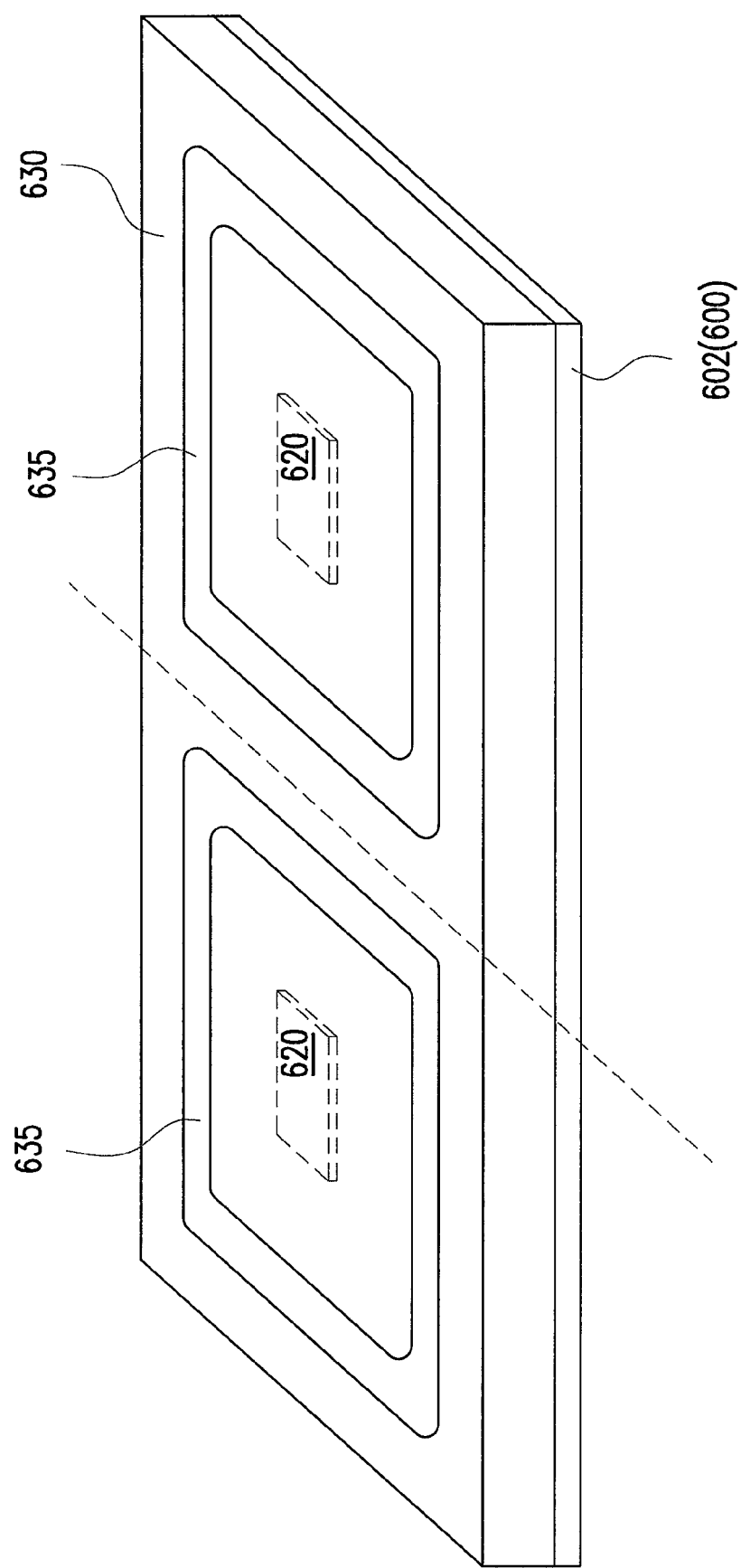
FIG. 6A"

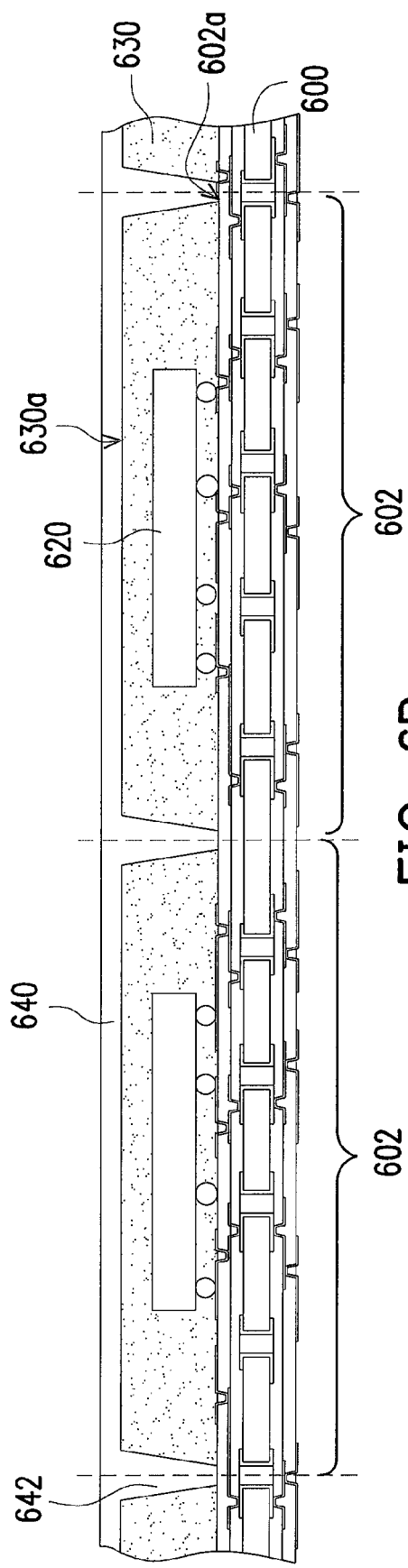
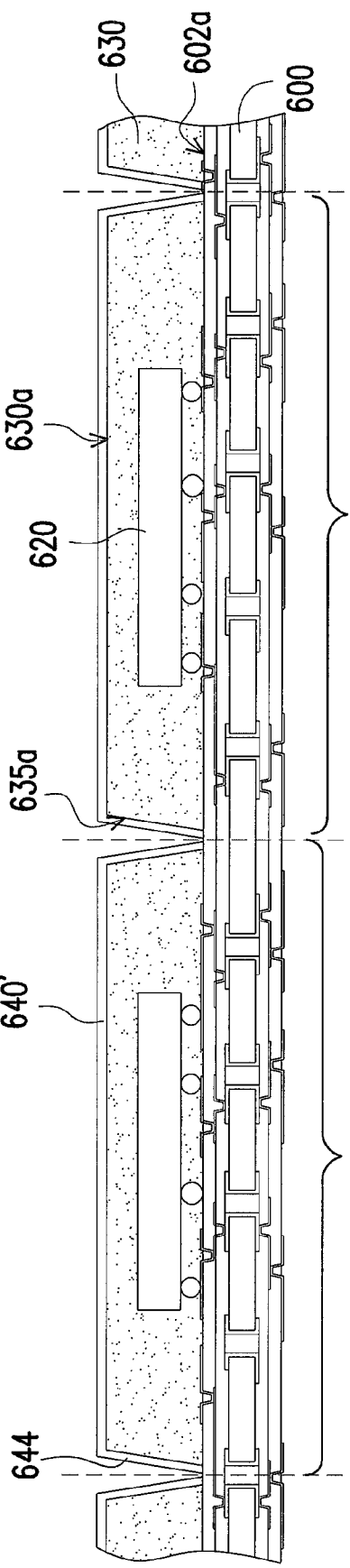
FIG. 6B
FIG. 6B'

CHIP PACKAGE AND MANUFACTURING METHOD THEREOF

CROSS-REFERENCE TO RELATED APPLICATION

This application claims the priority benefit of U.S. provisional application Ser. No. 61/109,937, filed on Oct. 31, 2008. The entirety of the above-mentioned patent application is hereby incorporated by reference herein and made a part of this specification.

BACKGROUND OF THE INVENTION

1. Field of the Invention

The present invention relates to a semiconductor device, and more particularly to a chip package.

2. Description of Related Art

Electro-magnetic interference (EMI) is a serious and challenging problem for most electronic devices or systems. As EMI disturbances commonly interrupt, degrade or limit the effective performance of the electronic device or the whole circuit of the electronic system, it is necessary for the electronic devices or systems to have efficient EMI protection to ensure the effective and safe operation.

EMI protection is particularly important in small-sized, densely packaged or sensitive electronic applications operating at high frequencies. Conventionally, EMI shielding solutions typically involve the use of metal plates and/or conductive gaskets, which are later attached or affixed at higher manufacturing costs.

SUMMARY OF THE INVENTION

In view of the foregoing, the present invention provides a manufacturing method of a chip package, which offers better design flexibility with less effort.

The present invention is further directed to a chip package with enhanced effectiveness of EMI shielding.

The present invention provides a chip package including a substrate, at least a chip disposed on the substrate, a molding compound and a shielding layer having a plurality of conductive connectors. The conductive connectors disposed on the substrate are arranged within the molding compound and around the chip. The shielding layer disposed over the molding compound covers the top surface of the molding compound and the shielding layer is electrically connected to the substrate through the conductive connectors.

According to embodiments of the present invention, the conductive connectors can be studs or plated via structures, either exposed by the sidewalls of the molding compound or not exposed by the sidewalls of the molding compound.

According to embodiments of the present invention, the chip is electrically connected to the laminate substrate of the chip package though a plurality of bumps.

The invention further provides a manufacturing method of a chip package. At least a chip is disposed on one of the substrate units of the matrix substrate, and the chip is electrically connected to the substrate unit. After forming a molding compound over the matrix substrate to encapsulate the chips, portions of the substrate units, a marking process is performed to form a plurality of vias by removing portions of the molding compound until a top surface of each substrate unit is exposed. Later, a shielding layer is formed over the molding compound to cover the molding compound and a plurality of connectors is formed within the vias to cover the exposed top surface of each substrate unit. Then a singulation process is performed to obtain a plurality of chip packages.

According to one embodiment of the present invention, the connectors can be arranged on sawing lines of the matrix substrate and on boundary lines of each substrate unit, so that the singulation process cuts through the connectors and the matrix substrate. Alternatively, the connectors can be arranged around boundary lines of each substrate unit with a distance apart, so that the singulation process does not cut through the connectors.

According to one embodiment of the present invention, the shielding layer and the connectors are formed from a conductive material by a spraying process, a sputtering process or a plating process.

According to one embodiment of the present invention, depending on whether the vias is filled up or partially filled, the shielding layer is formed simultaneously with a plurality of studs or plated via structures.

According to one embodiment of the present invention, the marking process comprises a laser digging process or a laser drilling process.

Based on the above, the shielding layer and the studs disposed on the substrate functions as an EMI shield of the chip package. According to the present invention, owning to the flexible and variable design of the shielding layer and the studs, the process window can be improved.

In order to the make the aforementioned and other objects, features and advantages of the present invention comprehensible, several embodiments accompanied with figures are described in detail below.

BRIEF DESCRIPTION OF THE DRAWINGS

FIGS. 1A through 1F' are schematic views showing manufacturing methods of the chip package according to preferred embodiments of the present invention.

FIGS. 6A through 6B' are schematic views showing certain steps of the manufacturing method of the chip package according to one preferred embodiment of the present invention.

DESCRIPTION OF EMBODIMENTS

Figure 1C:
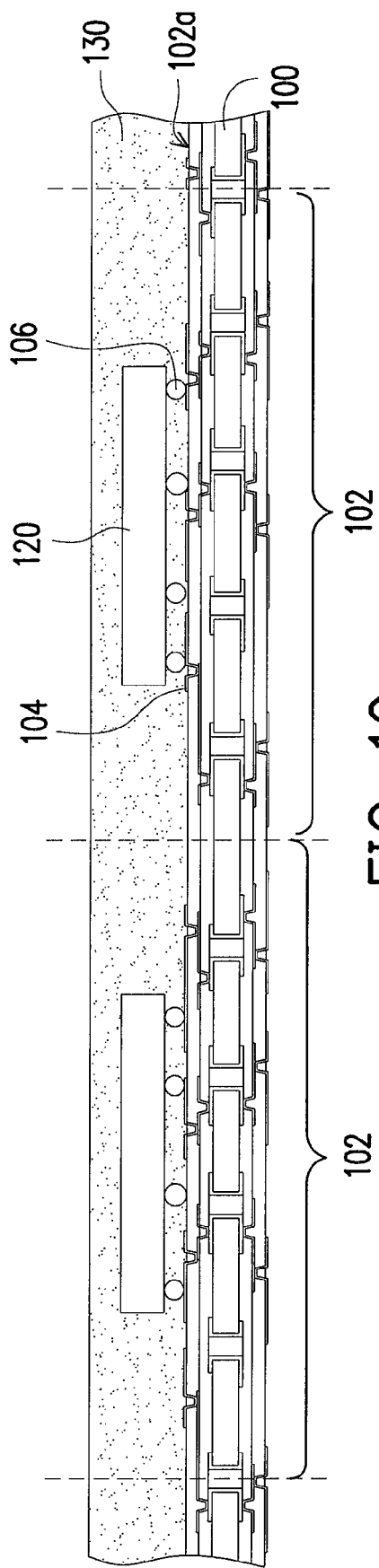

Reference will now be made in detail to the present preferred embodiments of the invention, examples of which are illustrated in the accompanying drawings. Wherever possible, the same reference numbers are used in the drawings and the description to refer to the same or like parts.

The manufacturing methods as described in the present invention can be used for fabricating various package structures and are more suitable for fabricating stacked type packages, multiple-chip packages, or high frequency device packages (including radio frequency device packages). Moreover, the manufacturing methods as described in the present invention are compatible with packaging processes utilizing build-up substrate manufacturing process or array substrate manufacturing process.

Figure 1D:
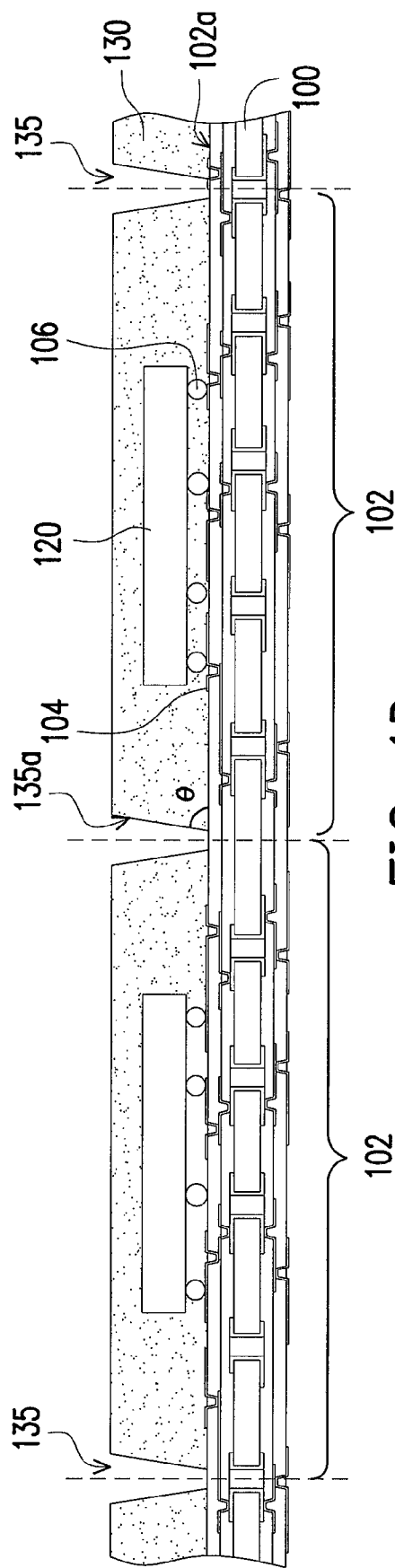
Figure 1D:
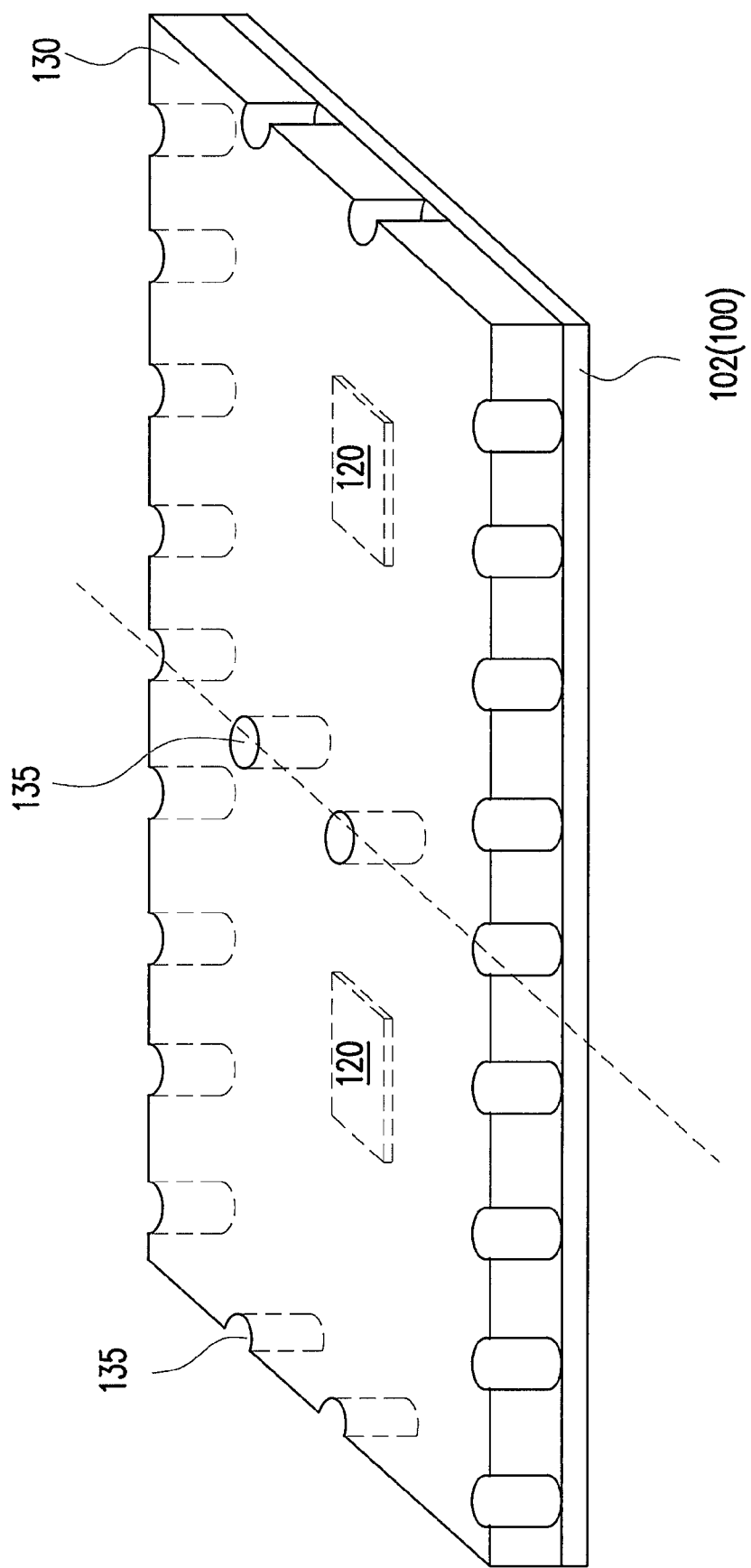

FIGS. 1A through 1F' are schematic views showing manufacturing methods of the chip package according to the preferred embodiments of the present invention. FIGS. 1D' and 1D" are shown in three-dimensional schematic views, while FIGS. 1A-1D, 1E-1F and 1E'-1F' are shown in cross-sectional schematic views.

Referring to FIG. 1A, a matrix substrate 100 having a plurality of substrate 102 (defined by the subsequent sawing lines shown as dotted lines) is provided, while each substrate 102 includes a plurality of contacts 104 thereon. The contacts 104 function as bump pads for flip chip connecting technology. The substrate 100 can be a laminate substrate, for example, a printed circuit board (PCB).

Referring to FIG. 1B, at least a chip 120 is disposed on the top surface 102a of each substrate 102. Although a chip is provided herein, other surface mount components can be employed, and encompassed within the scope of this invention. The chip 120 is electrically connected to the contacts 104 of the substrate 102 through a plurality of bumps 106 therebetween. Although flip chip connecting technology is described herein, it is well encompassed within the scope of this invention to employ wire bonding technology (i.e. through wire connections). The chip 120 preferably is disposed within a central portion of the substrate 102.

Referring to FIG. 1C, a molding process is carried out to form a molding compound 130 on the matrix substrate 100 to encapsulate the chips 120, the contacts 104, the bumps 106 and at least a portion of the substrate 102. The molding process can be an over-molding process, for example. The material of the molding compound 130 may be epoxy resins or silicon resins, for example.

Referring to FIG. 1D, a marking process is performed to form a plurality of vias (via holes) 135 by removing portions of the molding compound 130 until the top surface 102a of the substrate 102 is exposed. The vias 135 are arranged surrounding the location of the chip 120. Preferably, the vias 135 are arranged between the chip 120 and the boundary or perimeter of each substrate 102. FIG. 1D' is the 3D schematic view of the structure depicted in FIG. 1D. As shown in FIGS. 1D and 1D', the individual vias 135 are arranged right on the boundary lines of the substrate 102 (the dotted lines). In this case, the subsequent sawing process will cut through the vias 135 arranged at the sawing lines (shown as doted lines). The marking process may include a laser drilling process or a laser digging process, for example. In addition, the vias 135 formed by laser process can afford high diameter accuracy and provide controlled taper. Preferably, the taper of the vias 13 is controlled to have a tilt angle θ (between the sidewall 135a and the substrate surface 102a) ranging between about 60-90 degrees. Taking the vias 135 arranged around the boundary of each substrate 102 as an example, the marking process may removes portions of the molding compound 130 by drilling a plurality of separate holes arranged in a ring-shaped pattern within the molding compound 130, right on the boundary of each substrate 102.

On the other hand, the vias 135 may be arranged close to and within the boundary lines of the substrate 102 but are not located exactly on the boundary lines (the dotted lines) of the substrate 102, as shown in FIG. 1D". The vias 135 may be arranged surrounding the location of the chip 120 and close to the boundary lines of the substrate 102. For example, the vias 135 are arranged in a ring-shaped pattern and is spaced out from the boundary lines of the substrate 102 by a preset distance d, and d can be varied according to product requirements. However, the subsequent sawing process will not cut through the vias 135 arranged near the sawing lines. In general, the sizes or the shape of the vias 135 can be altered depending on the shielding requisites or other electrical properties of the package or even varied in accordance with the processing parameters.

Figure 1E:
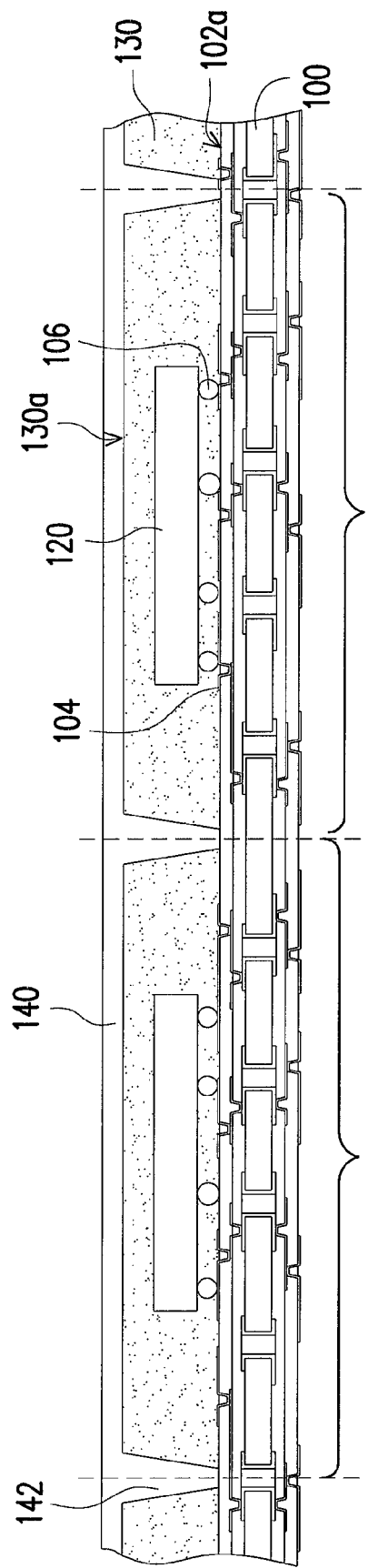

Referring to FIG. 1E, a shielding layer 140 is formed over the molding compound 130 to cover the top surface 130a of the molding compound 130, fill up the vias 135 and cover the exposed top surfaces 102a of the substrate 102 (i.e. the top surface 102a of the substrate 102 exposed by the vias 135). The shielding layer 140 can be formed by depositing a metal material (not shown) to cover the molding compound and fill up the vias 135 using a spray coating method, a plating method, or a sputtering method, for example. The metal material can be, for example, aluminum, copper, chromium, gold, silver, nickel, solder materials, or the combinations thereof. The studs 142 are simultaneously formed by filling up vias 135 during the process of forming the shielding layer 140.

Figure 1F:
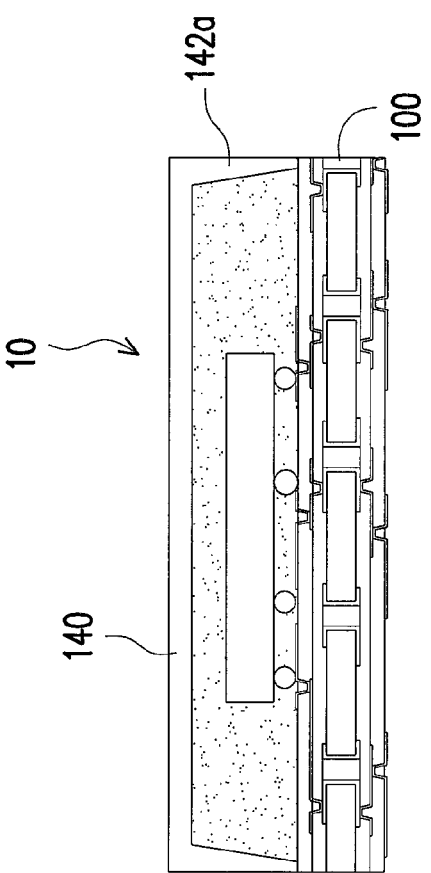

Finally, referring to FIG. 1F, a singulation process is performed to obtain the individual chip packages 10. The singulation process may be a blade sawing process, for example. As shown in FIGS. 1E-1F, the singulation process cuts through the studs 142 and the matrix substrate 100 so as to form the individual packages 10 with semi-studs 142a.

Alternatively, as shown in FIG. 1E', the shielding layer 140' may be formed over the molding compound 130 to cover the top surface 130a of the molding compound 130, and to conformally cover the sidewalls 135a of the vias 135 and the exposed top surfaces 102a of the substrate 102 to form a plurality of plated via structures 144. This way, the shielding layer 140' can be formed by depositing a metal material (not shown) to cover the molding compound without filling up the vias 135 by using a spray coating method, a plating method, or a sputtering method, for example. The plated via structure 144 may shaped as a cup or an inverted cap, depending on the shape or size of the vias 135. Following FIG. 1E', as shown in FIG. 1F', a singulation process is performed to cut through the matrix substrate 100 and the plated via structures 144 so as to obtain the individual chip packages 10 and semi-plated vias 144a. The singulation process may be a blade sawing process, for example.

Figure 2:
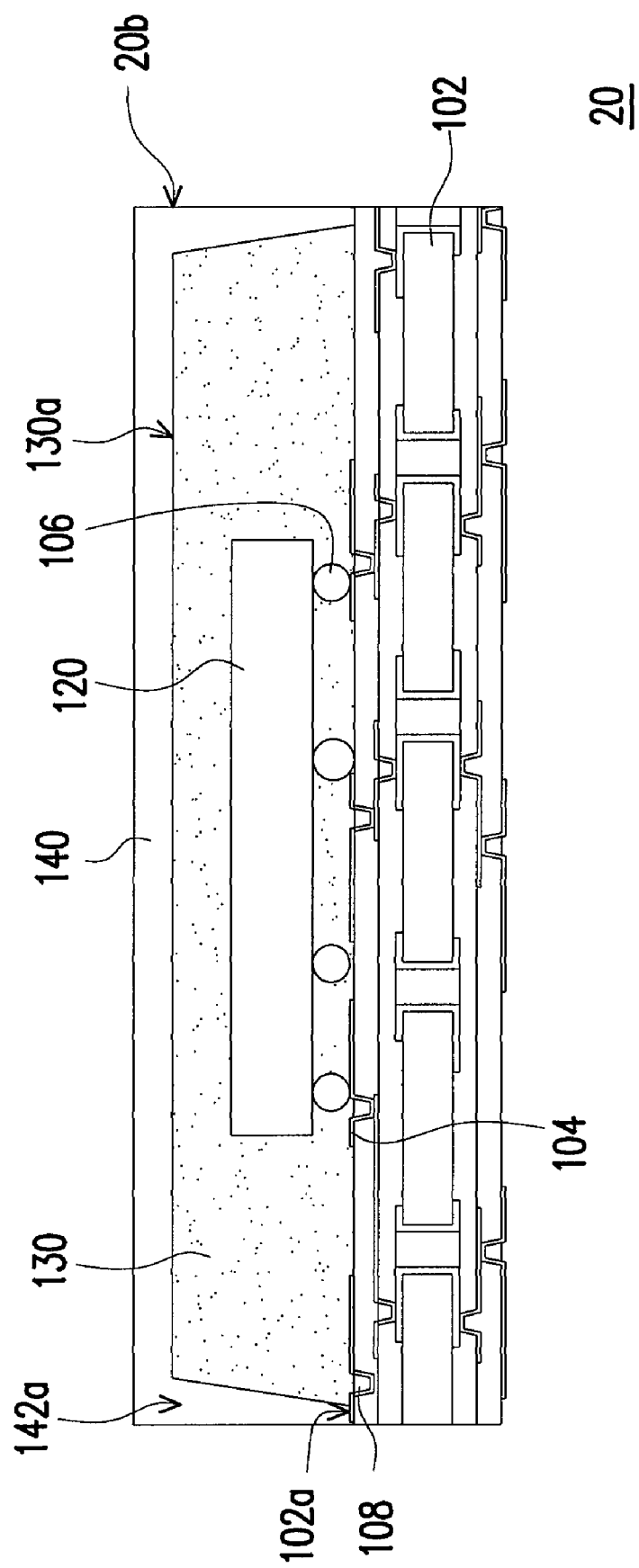
FIG. 2 is a cross-sectional view of a chip package according to an embodiment of the present invention.

FIG. 2 is a cross-sectional view of a chip package according to a preferred embodiment of the present invention. Referring to FIG. 2, the chip package 20 of the present embodiment includes a substrate 102, a plurality of contacts 104, a plurality of bumps 106, at least a chip 120, a molding compound 130 and a shielding layer 140. The substrate 102 can be a laminated substrate, for example, a two-layered or a four-layered laminated PCB substrate. The chip 120 can be a semiconductor chip, for example, a radio-frequency (RF) chip. The material of the shielding layer 140 may be copper, chromium, gold, silver, nickel, aluminum or alloys thereof or even a solder material, for example. The chips 120 are electrically connected to the substrates 102 through the contacts (bump pads) 104 and the bumps 106. The molding compound 130 encapsulates portions of the substrates 102, the bumps 106, and the chip 120. The shielding layer 140 includes a plurality of semi-studs 142a. The semi-studs herein refers to the cut studs from FIG. 1F, but can be regarded as studs in other contexts. The shape or structure of the studs 142 correlates to the location arrangements of the vias 135, as the studs 142 are formed to fill up the vias 135 (FIG. 1E). As shown in FIG. 2, the shielding layer 140 is disposed over the molding compound 130, covering the top surface 130a, while the semi-studs 142a covers the exposed top surfaces 102a of the substrate 102. As the studs 142 are cut through along with the molding compound 130 (cutting through the sawing lines) during the singulation process (FIG. 1F), portions of the molding compound 130 and the semi-studs 142a are exposed from the side surface 20b of the chip package 20. The shielding layer 140 is electrically connected to the substrate 102 through the semi-studs 142a and at least a ground vias 108 of the substrate 102, and the shielding layer 140 is electrically grounded through the semi-studs 142a and the ground via 108. Hence, taking advantage of the metal wirings or traces of the substrate surface, the shielding layer of the present invention can be grounded within the package structure using the ground plane of the substrate.

Figure 3:
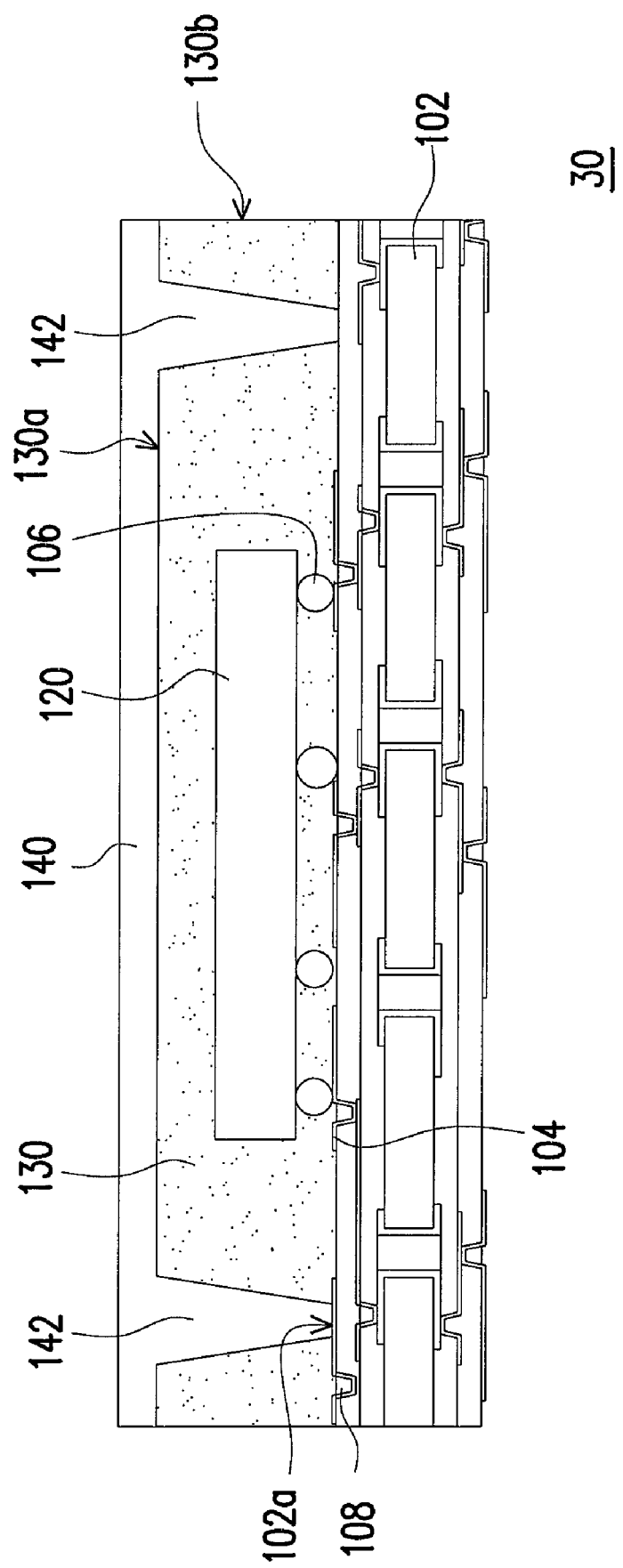
FIG. 3 is a cross-sectional view of a chip package according to another embodiment of the present invention.

According to another embodiment, as shown in FIG. 3, the shielding layer 140 is disposed over the molding compound 130 covering the top surface 130a of the molding compound 130. The shielding layer 140 also includes a plurality of studs 142 that are disposed on the substrate 102 and within the molding compound 130, covering the exposed top surfaces 102a of the substrate 102. Basically, the package structure 30 follows the manufacturing step shown in FIG. 1D" (rather than FIG. 1D), and the sawing process does not cut through the studs 142 arranged near the sawing street lines. In fact, the studs 142 can be considered as the filled vias structures, and the locations of the studs 142 in FIG. 3 are arranged surrounding the chip 120 and between the chip and the boundary lines of the substrate 102. Hence, the sidewalls 130b of the molding compound 130 are exposed, while the studs 142 are not exposed from the side surface of the chip package 30.

Figure 4:
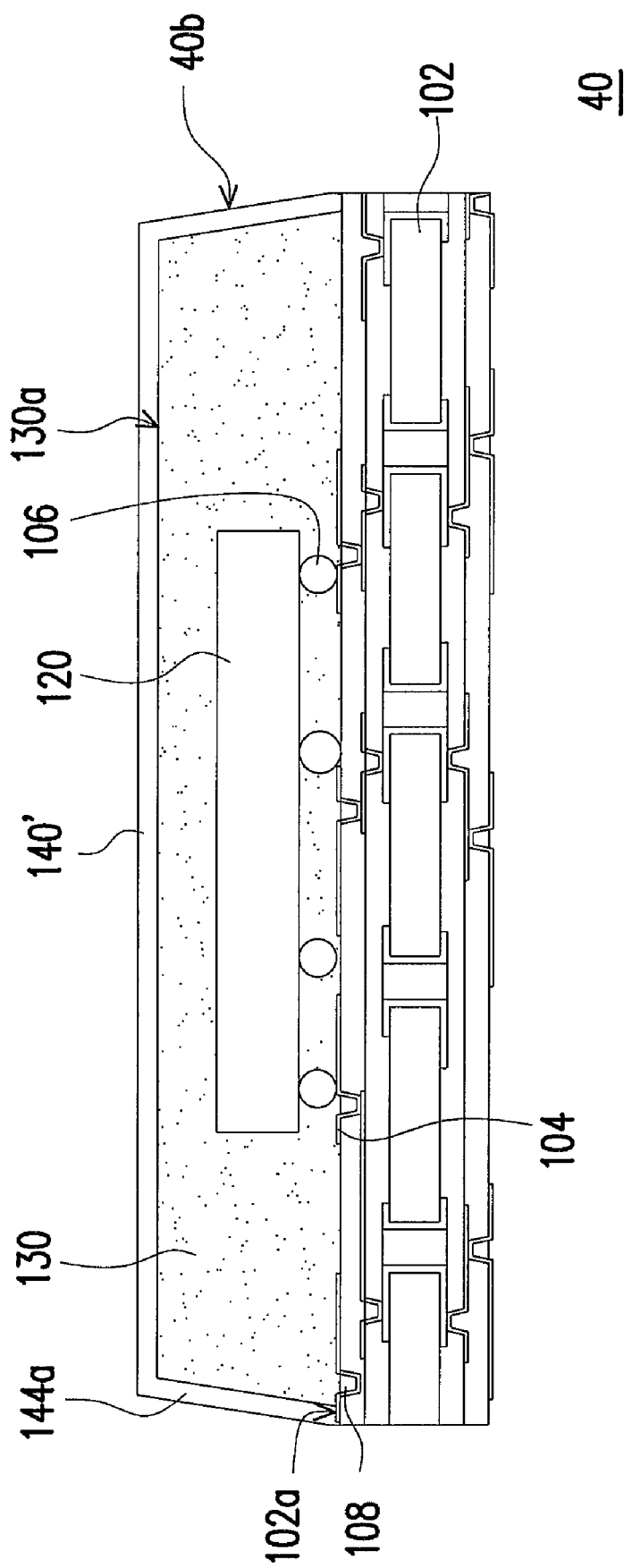
FIG. 4 is a cross-sectional view of a chip package according to another embodiment of the present invention.

According to another embodiment, as shown in FIG. 4, the package structure 40 is obtained following the manufacturing steps shown in FIGS. 1D, 1E' and 1F', the shielding layer 140' includes a plurality of semi-plated via structures 144a. The semi-plated via structures herein refers to the cut plated via structures from FIG. 1F', but can be regarded as plated via structures in other contexts. The shape or structure of the semi-plated via structures 144 correlates to the location arrangements of the vias 135, as the plated via structures 144 are formed as conformal coatings of the vias 135 (FIG. 1E'). As shown in FIG. 4, the shielding layer 140' covers the top surface 130a of the molding compound 130, while the semi-plated via structures 144a covers the exposed top surfaces 102a of the substrate 102. As the plated via structures 144 are cut through along with the molding compound 130 (cutting through the sawing lines) during the singulation process (FIG. 1F'), portions of the molding compound 130 and the semi-plated via structures 144a are exposed from the side surface 40b of the chip package 40. The shielding layer 140' is electrically connected to the substrate 102 through the semi-plated via structures 144a and at least a ground vias 108 of the substrate 102, and the shielding layer 140' is electrically grounded through the semi-plated via structures 144a and the ground via 108.

Figure 5:
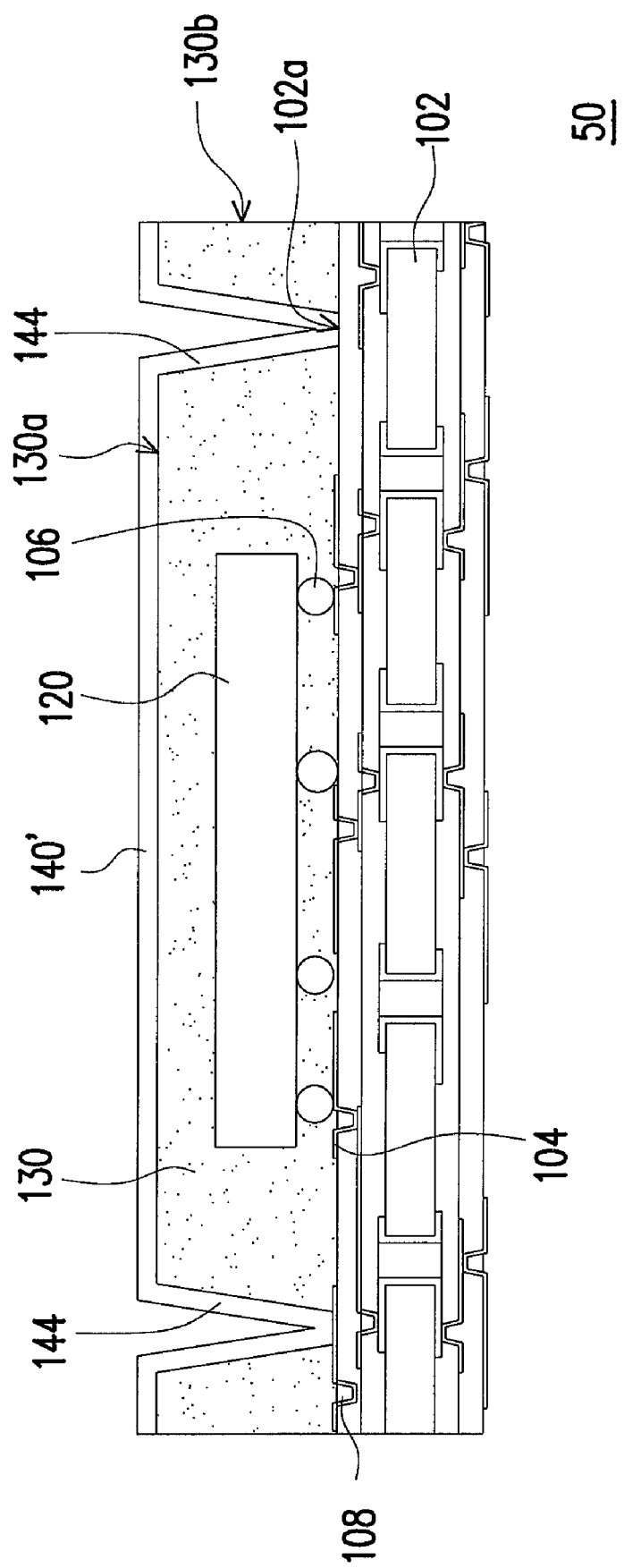
FIG. 5 is a cross-sectional view of a chip package according to another embodiment of the present invention.

Alternatively, as shown in FIG. 5, for the package structure 50 following the manufacturing step shown in FIG. 1D" and FIG. 1E', the shielding layer 140' includes a plurality of plated via structures 144. As the sawing process does not cut through the plated via structures 144 arranged near the sawing street lines, the sidewalls 130b of the molding compound 130 are exposed, while the plated via structures 144 are not exposed from the side surface of the chip package 50.

In brief, the studs (either cut semi-studs or uncut studs) or the plated via structures (either cut or uncut) can be considered as metal connectors of the top shielding layer. The shielding layer is physically and/or electrically connected to the underlying substrate through the studs (either cut semi-studs or uncut studs) or the plated via structures (either cut or uncut).

In accordance with the present invention, the manufacturing methods of the chip package shown in FIGS. 1A through 1F' may be further modified and described in the following embodiments.

Figure 6A:
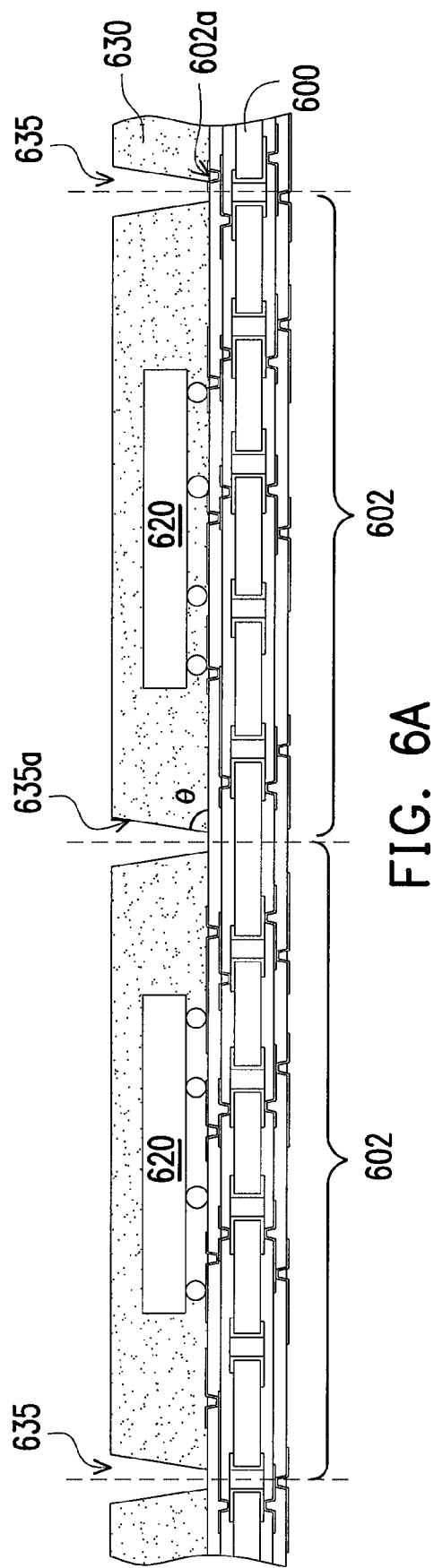
Figure 6A:
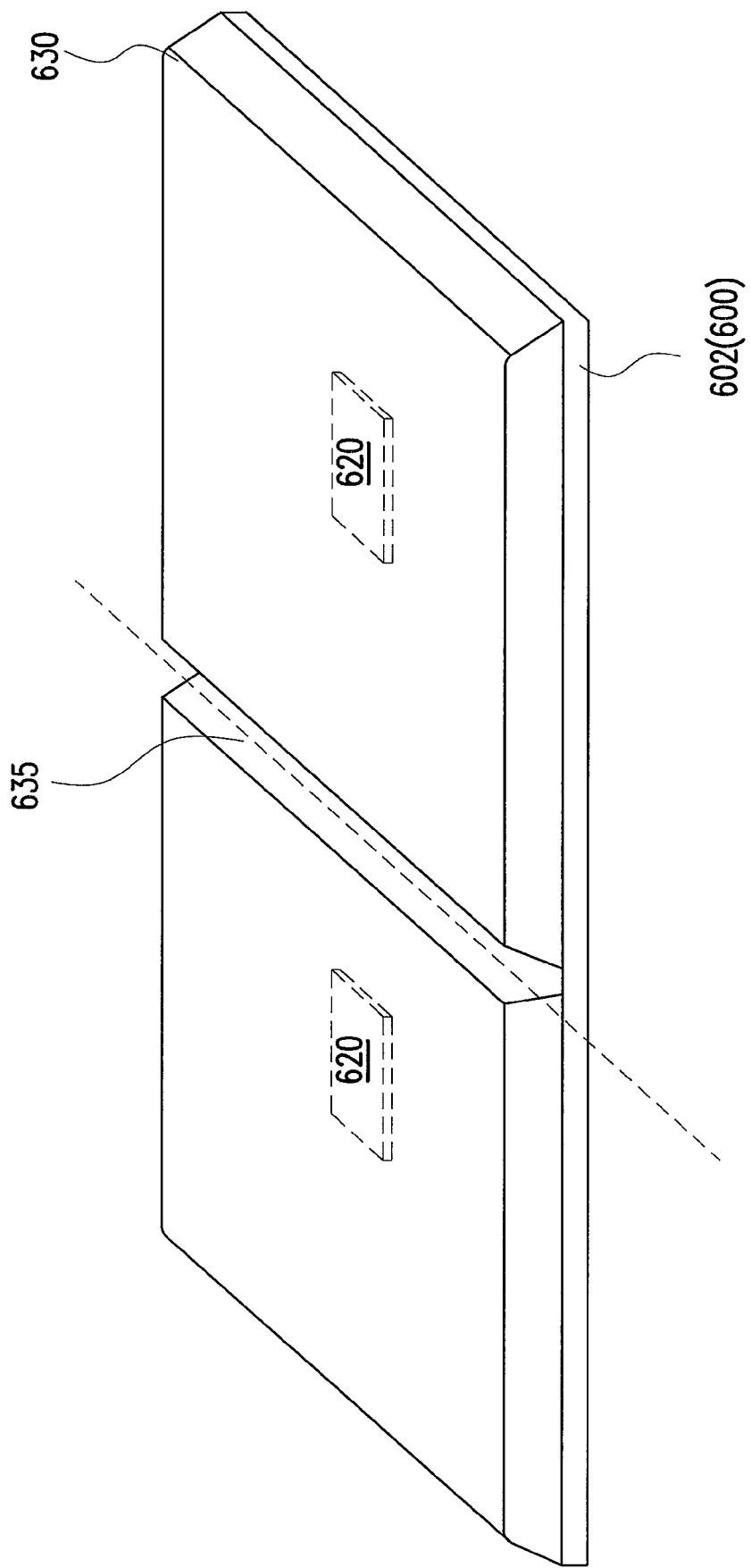

Following the process steps shown in FIGS. 1A-1C, as shown in FIG. 6A, a marking process is performed to form a plurality of trenches 635 by removing portions of the molding compound 630 until the top surface 602a of the substrate 602 is exposed. The trenches 635 are arranged surrounding the locations of the chips 620. Preferably, the trench is a ring-shaped trench and each trench 635 is arranged between the chip and the boundary or perimeter of each substrate 602. FIG. 6A' is the 3D schematic view of the structure depicted in FIG. 6A. As shown in FIGS. 6A and 6A', the individual trenches 635 are arranged right on the boundary lines of the substrate 602 (the dotted lines). In a way, the trenches 635 formed by the marking process are of a grid or latticed pattern. In this case, the subsequent sawing process will cut through the trenches 635 arranged at the sawing lines (shown as doted lines). The marking process may include a laser drilling process or a laser digging process, for example. In addition, the trenches 635 formed by laser process can afford high diameter accuracy and provide controlled taper. Preferably, the taper of the trench 635 is controlled to have a tilt angle θ (between the sidewall 635a and the substrate surface 602a) ranging between about 60-90 degrees. Taking the trenches 635 arranged at the boundary of each substrate 602 as an example, the marking process may removes portions of the molding compound 630 by drilling a plurality of ring-shaped trenches within the molding compound 630, right on the boundary of each substrate 602.

On the other hand, the trenches 635 may be arranged near and inside the boundary lines of the substrate 602 but are not exactly located on the boundary lines (the dotted lines) of the substrate 602, as shown in FIG. 6A". The trenches 635 may be arranged close to the boundary lines of the substrate 602. However, the subsequent sawing process will not cut through the trenches 635 arranged near the sawing lines. In general, the sizes or the shape of the trenches 635 can be altered, depending on the shielding requisites or other electrical properties of the package or even varied in accordance with the processing parameters.

Similar to the step of FIG. 1E, a shielding layer 640 is formed over the molding compound 630 to cover the top surface 630a of the molding compound 630, fill up the trenches 635 and cover the exposed top surfaces 602a of the substrate 602 (i.e. the top surface 602a of the substrate 602 exposed by the trenches 635) to form filled ring structures 642 as shown in FIG. 6B. Alternatively, similar to the step of FIG. 1E', the shielding layer 640' may be formed over the molding compound 630 to cover the top surface 630a of the molding compound 630, and to conformally cover the sidewalls 635a of the trenches 635 and the exposed top surfaces 602a of the substrate 602 to form a plurality of hollow ring structures 644, as shown in FIG. 6B'.

Finally, following the singulation process shown in FIG. 1F or 1F', the individual chip packages are obtained.

Figure 7:
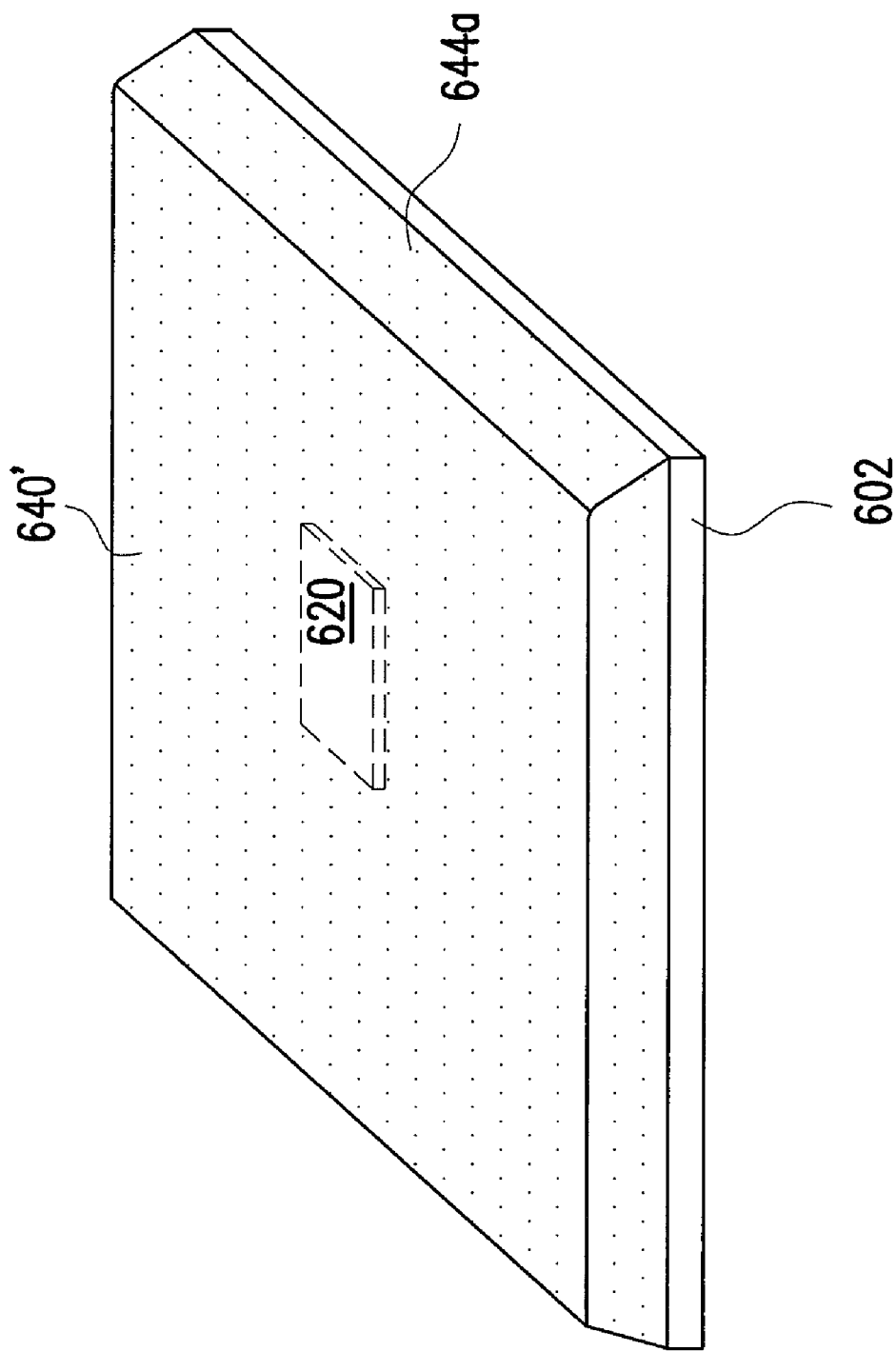
FIG. 7 is a 3D schematic view of a chip package according to another embodiment of the present invention.

According to another embodiment, as shown in FIG. 7, the package structure 70 is obtained following the manufacturing steps shown in FIGS. 1A-1C, 6A and 6B', the shielding layer 640' includes a plurality of cut hollow ring structures 644a. As shown in FIGS. 6B' and 7, the shielding layer 640' covers the top surface 630a of the molding compound 630, while the cut (or semi-) plated ring structures 644a covers the sidewalls 635a of the molding compound 630. As the singulation process cuts through the plated hollow ring structures 644 (cutting through the sawing lines), only the cut ring structures 644a can be seen (exposed) from the side surface of the chip package 70. The shielding layer 640' is electrically connected to the substrate 602 through the cut hollow ring structures 644a and at least a ground vias 608 of the substrate 602, and the shielding layer 640' is electrically grounded through the semi-plated ring structures 644a and the ground via 608.

Figure 8:
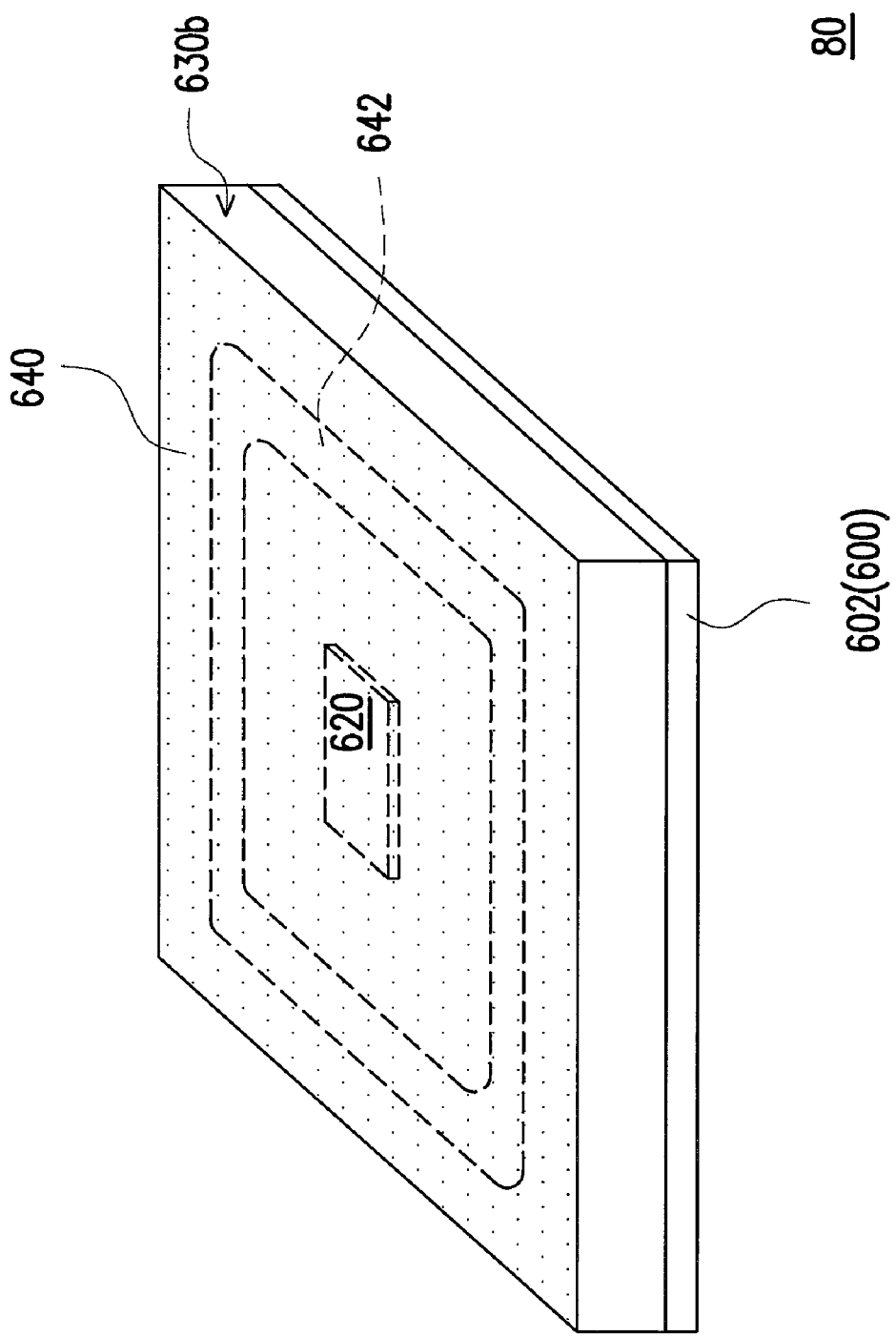
FIG. 8 is a 3D schematic view of a chip package according to another embodiment of the present invention.

Alternatively, as shown in FIG. 8, for the package structure 80 following the manufacturing step shown in FIG. 1A-1C, 6A" and 6B, the shielding layer 640 covers the top surface 630a of the molding compound 630 and includes a plurality of filled ring structures 642. As the sawing process does not cut through the solid ring structures 642 arranged near the sawing street lines, the sidewalls 630b of the molding compound 630 are exposed, while the filled ring structures 642 are not exposed from the side surface of the chip package 80.

In brief, the solid ring structures (either cut ring structures or uncut ring structures) or the hollow ring structures (either cut or uncut) can be considered as metal connectors of the top shielding layer. The shielding layer is physically and/or electrically connected to the underlying substrate through the solid ring structures (either cut or uncut) or the hollow ring structures (either cut or uncut).

In the chip package structures of the present embodiment, the shielding layer and the connectors disposed on the substrate together function as an EMI shield, protecting the package from the EMI radiation from the surrounding radiation sources.

The design of the EMI shielding for the package structure of this invention can be flexibly adjusted according to the product requirements because the shape or locations of the vias 135 can be precisely controlled by the marking process. Furthermore, as the shielding layer includes connectors arranged within the molding compound, the EMI shielding performance is improved.

In summary, the shielding layer together with the conductive connectors can efficiently shelter the chip package of the present invention from the outside EMI radiation, thus boosting the EMI shielding. Following the manufacturing processes disclosed in the present invention, it is possible to establish an electrical ground path within the package structure, devoid of using an extra ground plane. Accordingly, such design is compatible with the packaging of high frequency devices, particularly, radio frequency devices.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A chip package, comprising:
   a substrate;
   at least a chip disposed on the substrate and electrically connected to the substrate;
   a molding compound disposed over the substrate, at least encapsulating the chip, and a portion of the substrate; and
   a shield including:
      a plurality of conductive connectors circumscribing a lateral periphery of the molding compound, wherein a side surface of at least one of the plurality of conductive connectors is exposed, and wherein the at least one of the conductive connectors is connected to the substrate; and
      a first portion disposed over portions of the molding compound, wherein the first portion is electrically connected to the conductive connectors;
      wherein the side surface of the at least one of the plurality of conductive connectors is exposed at an external periphery of the shield, and is inwardly indented such that the external periphery of the shield is inwardly indented.

2. The chip package as claimed in claim 1, wherein the conductive connectors are individual conductive vias, separate from one another and partially exposed from the molding compound.

3. The chip package as claimed in claim 2, wherein at least one of the conductive vias has an exposed side surface.

4. The chip package as claimed in claim 1, wherein:
   the side surface of the at least one of the plurality of conductive connectors extends from a first part of the lateral periphery of the molding compound to a second part of the lateral periphery of the molding compound.

5. The chip package as claimed in claim 3, wherein at least one of the exposed conductive vias has an exposed upper surface.

6. The chip package as claimed in claim 1, wherein the plurality of conductive connectors provide at least partial EMI shielding.

7. The chip package as claimed in claim 1, wherein a subset of the plurality of conductive connectors provide at least partial EMI shielding.

8. The chip package as claimed in claim 1, further comprising a ground path extending from a lower surface of the substrate to the shield.

9. A semiconductor package comprising:
   a substrate;
   a chip attached to the substrate;
   a package body encapsulating the chip; and
   a shield including:
      a first portion disposed on an exterior upper surface of the package body; and
      a plurality of conductive vias circumscribing the chip, at least one of the plurality of conductive vias having a side surface that is exposed;
      wherein the first portion is electrically connected to the substrate through the plurality of conductive vias;
      wherein the side surface of the at least one of the plurality of conductive vias is exposed at an external periphery of the shield, and is inwardly indented such that the external periphery of the shield is inwardly indented.

10. The semiconductor package as claimed in claim 9, wherein:
    the side surface of the at least one of the plurality of conductive vias extends laterally from a first part of an exterior lateral surface of the package body to a second part of the exterior lateral surface of the package body.

11. The semiconductor package as claimed in claim 9, Wherein at least one of the plurality of conductive vias is located within the package body.

12. The semiconductor package as claimed in claim 9, wherein the plurality of conductive vias include at least one plated via structure.

13. The semiconductor package as claimed in claim 9, further comprising:
    a ground path extending from a lower surface of the substrate to the first portion of the shield.

14. A semiconductor package comprising:
    a substrate including at least one ground via;
    a semiconductor die disposed on the substrate;
    a package body encapsulating the die, the package body having an upper surface; and a shield including:
- a first portion disposed on the upper surface of the package body; and
- a lateral portion including a plurality of conductive vias extending from the first portion to the substrate and circumscribing the semiconductor die, wherein at least one of the plurality of conductive vias includes a side surface that is exposed;
- wherein the first portion is electrically connected to the lateral portion;

wherein the side surface of the at least one of the plurality of conductive vias is exposed at an external periphery of the shield, and is inwardly indented such that the external periphery of the shield is inwardly indented.

15. The semiconductor package as claimed in claim 14, wherein the plurality of conductive vias extend from an upper surface of the substrate to the upper surface of the package body.

16. The semiconductor package as claimed in claim 14, wherein:
- at least one of the plurality of conductive vias is electrically connected to a corresponding ground via; and
- the shield is electrically connected to the substrate through the plurality of conductive vias and the corresponding ground via.

17. The semiconductor package as claimed in claim 14, wherein the lateral portion of the shield is disposed on at least one lateral surface of the package body and electrically connected to at least one of the plurality of conductive vias.

18. The semiconductor package as claimed in claim 14, wherein:
- the side surface of the at least one of the plurality of conductive vias extends from a first part of a lateral surface of the package body to a second part of the lateral surface of the package body.

* * * * *